United States Patent [19]

Sawaya

[11] Patent Number: 4,807,087
[45] Date of Patent: Feb. 21, 1989

[54] SINGLE-IN-LINE TYPE SEMICONDUCTOR DEVICE

[75] Inventor: Hiromichi Sawaya, Kawasaki, Japan

[73] Assignee: Kabushiki Kaisha Toshiba, Kawasaki, Japan

[21] Appl. No.: 121,955

[22] Filed: Nov. 18, 1987

[30] Foreign Application Priority Data

Nov. 20, 1986 [JP] Japan .................................. 61-277329

[51] Int. Cl.$^4$ ............................................... H05K 1/16
[52] U.S. Cl. ................................. 361/405; 228/180.1; 439/83
[58] Field of Search ................. 439/83, 876; 357/81, 357/68; 174/52 FP; 165/80.2, 80.3, 185; 228/180.1; 338/312, 329; 361/306–310, 383, 386–388, 405, 417–419, 433 T

[56] References Cited

U.S. PATENT DOCUMENTS

| | | | |
|---|---|---|---|
| 4,387,413 | 6/1983 | Griffis | 361/405 |
| 4,521,828 | 6/1985 | Fanning | 361/386 |
| 4,656,442 | 4/1987 | Hayakawa | 361/405 |

OTHER PUBLICATIONS

U.S. Ser. No. 088,285, filed on Aug. 24, 1987, entitled "Semiconductor Device".

Primary Examiner—Gerald P. Tolin
Attorney, Agent, or Firm—Finnegan, Henderson, Farabow, Garrett, & Dunner

[57] ABSTRACT

Disclosed herewith is a single in-line type semiconductor device having external leads drawn out from a package in staggered fashion. According to the single in-line type semiconductor device of this invention, a narrow portion to be fitted in an opening formed in a printed circuit board is provided at each of first and second external leads, with the remaining portion of each external lead constituting a wide portion. The first and second external leads are each provided with a positioning portion defined by the narrow and wide portions. The linear distance between one edge portion of the package and the positioning portion of each first external lead is equal to the linear distance between the edge portion of the package and the positioning portion of each second external lead.

4 Claims, 2 Drawing Sheets

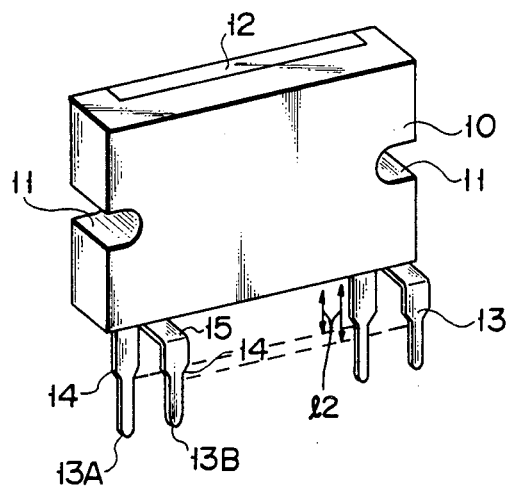
F I G. 4
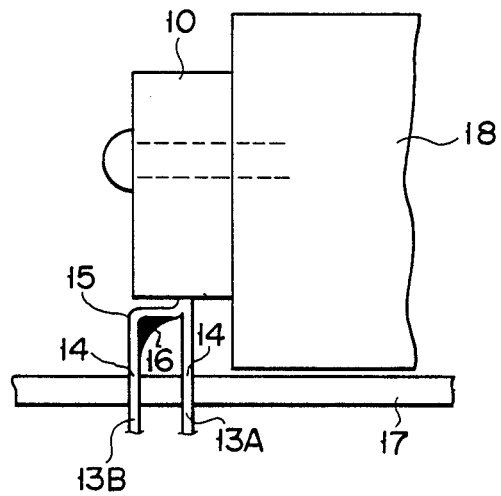
F I G. 5

SINGLE-IN-LINE TYPE SEMICONDUCTOR DEVICE

BACKGROUND OF THE INVENTION

The present invention relates to a single in-line type semiconductor device having external leads extending therefrom in staggered fashion.

An example of a power IC for use in audio control, motor control or the like, is a single in-line package (hereinafter referred to as SIP) type which has external leads extending from only one end face of the package. This SIP type IC can be classified into two types:

(1) a lead straight type having external leads arranged in a row, and (2) a staggered type having every other external lead bent, so that the external leads are arranged in two rows in staggered fashion.

FIG. 1 is a perspective view illustrating the outline of a conventional staggered type IC. In the drawing, numeral 10 is a package made of insulative resin, ceramic, or the like. This package 10 is provided with a pair of notches 11 through which screws are fitted to fix an external heat discharge plate to the package. Further, a metal heat discharge plate 12 is embedded in one surface of this package 10. Though not illustrated, a semiconductor pellet is disposed on discharge plate 12 within package 10. A plurality of external leads 13 formed by stamping a metal plate are drawn out from the bottom edge portion of package 10, and are arranged in two rows in staggered fashion with every other external lead being bent. That is, individual leads 13A in one of these two rows extend vertically from the bottom edge portion of package 10, and the remaining leads 13B in the other row, each arranged adjacent to its corresponding external lead 13A, are bent as illustrated. The free ends of these leads 13 are formed narrow, so as to be insertable in openings or through-holes formed in a printed circuit board (not shown). A so-called positioning portion 14 is provided at the boundary of the narrow portion and the remaining wide portion of each lead 13. This positioning portion 14 is provided to prevent each lead 13, when inserted, for soldering, in the through-hole of the printed circuit board, from penetrating deeper than that boundary position, thereby determining the position, and mainly the height, of the IC.

Conventionally, in forming the positioning portion 14, the individual leads are formed through a stamping process first without bending any, so that their narrow portions have the same length, and then every other lead is subjected to a bending process. According to the prior art, therefore, as is shown in FIG. 2, the linear length L1 of each external lead 13A which is not bent from the bottom edge portion of package 10 to its positioning portion 14 is longer than the linear length L2, of each bent external lead 13B. The positioning portions 14 of bent external leads 13B do not therefore contribute to the positioning of the IC at the time it is soldered on the printed circuit board.

In soldering such an IC on a printed circuit board, a solder layer coating known as a solder dip is performed on the external leads, in advance, to facilitate an easier soldering operation. As a result of this solder dip being carried out, a solder ball 16 is formed on the inner side of a bent portion 15 of each bent external lead 13B, as shown in FIG. 3 (side view). This solder ball 16 is formed with a large variation, so that package 10 may be fixed inclined to a printed circuit board 17 at the time external leads 13 are fitted, for soldering, in the openings of printed circuit board 17. If package 10 is fixed in such an inclined state, when screws are fit through notches 11 to fix the package to an external heat discharge plate 18, the package will be subjected to stress generated by the screwing action. As a result, cracking may occur in the semiconductor pellet (not shown) inside package 10, or wiring lines on board 17 may become separated therefrom when it is attempted to forcibly settle the package 10 straight.

SUMMARY OF THE INVENTION

With the above situation in mind, therefore, it is an object of this invention to provide a semiconductor device, which can always fix a package straight to a printed circuit board at the time its external leads are soldered to the circuit board, thereby preventing cracking from occurring in an internal semiconductor pellet and separation of wiring lines from the circuit board, problems which occur frequently when assembling the conventional semiconductor device.

A semiconductor device according to this invention comprises:

a package;

a plurality of first external leads drawn vertically from one edge portion of the package and arranged in a row;

a plurality of second external leads drawn out from the edge portion between the first external leads and bent to be arranged in parallel to the first external leads; and a positioning portion constituted by a boundary between a narrow portion, provided at a free end of each of the first and second external leads and to be inserted in an opening formed in a printed circuit board, and a wide portion other than the narrow portion, the positioning portion of each of the first and second external leads being set to be separated a predetermined distance from a bent portion of an associated second external lead, with the linear length of each of the first external leads from the edge portion of the package to the positioning portion thereof being equal to that of each of the second external leads, from the edge portion of the package to the positioning portion thereof.

With the above arrangement of the present invention, it can be ensured that a solder ball—which is formed in advance at the bent portion of each second external lead, when the solder dip is performed on the external leads—will not reach the positioning portion.

According to this invention, therefore, the external leads can be soldered directly to a printed circuit board, thus preventing cracking from occurring in an internal semiconductor pellet or separation of wiring lines from the circuit board, which are common occurrences in the case of assembling prior art devices.

In addition, the positioning portions provided at the first and second external leads contribute to positioning of the semiconductor device at the time they are soldered to the printed circuit board.

BRIEF DESCRIPTION OF THE DRAWINGS

FIG. 4 is a perspective view illustrating an outline of a semiconductor device according to this invention; and FIG. 5 is a side view of the semiconductor device shown in FIG. 4, mounted on a printed circuit board.

DETAILED DESCRIPTION OF THE PREFERRED EMBODIMENT

An embodiment of this invention will now be explained referring to the accompanying drawings.

FIG. 4 is a perspective view showing the outline of a semiconductor device according to one embodiment of this invention.

Figure 1:
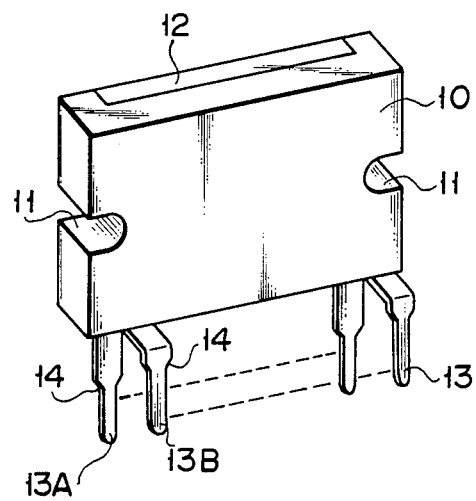
FIG. 1 is a perspective view illustrating an outline of a conventional semiconductor device.
Figure 2:
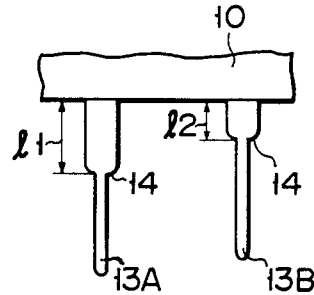
FIG. 2 is a partly-enlarged side view of the conventional semiconductor device shown in FIG. 1 with its external leads enlarged.
Figure 3:
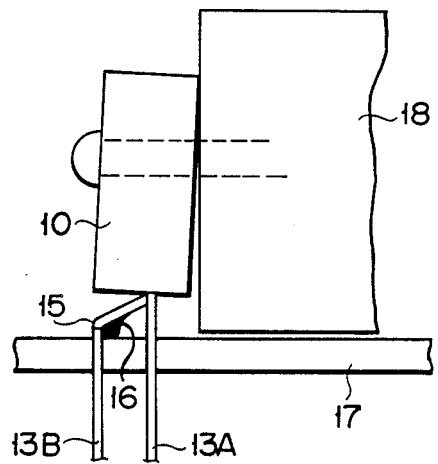
FIG. 3 is a side view of the conventional semiconductor device mounted on a printed circuit board.

In the drawing, numeral 10 is a package made of an insulative resin, ceramic or the like. Like the prior art device, this package 10 is provided with a pair of notches 11 through which screws are fit to fix an external heat-discharge plate to the package. Further, a metal heat discharge plate 12 is embedded in one surface of this package 10. A plurality of external leads 13 formed by stamping a metal plate are drawn out from the bottom edge portion of package 10 and these external leads 13 are arranged in two rows in a staggered fashion. More specifically, individual leads 13A in one of these two rows extend vertically from the bottom edge portion of package 10, and the remaining leads 13B in the other row, each arranged adjacent to its corresponding external lead 13A, are bent at a 90° angle, and again at a 90° angle, so as to continue in the original direction as illustrated. The free ends of these leads 13 are formed narrow to be insertable in openings or through holes formed in a printed circuit board. A positioning portion 14 is provided at the boundary of the narrow portion and the remaining wide portion of each lead 13. The distance between a bent portion 15 of each bent external lead 13B and its positioning portion 14 is set sufficiently large. To be specific, positioning portion 14 of each external lead 13B is provided at a lower portion thereof 0.5 mm to 1.5 mm below the center of a circle internally touching bent portion 15. The range 0.5 mm to 1.5 mm is properly determined on the basis of the time required for the solder dip process, the temperature in the dipping process and the shape of bent portion 15. Furthermore, the linear lengths, L1 and L2 shown in FIG. 2 are set to equal each other.

In fixing thus constituted semiconductor device to a printed circuit board by soldering and fixing it to an external heat discharge plate by means of screws as shown in FIG. 5, positioning portions 14 provided at bent external leads 13B can also contribute to the positioning of package 10 at the time of soldering these leads 13 to the circuit board. In addition, since the distance from bent portion of 15 of each external lead 13B to its positioning portion 14 is set sufficiently large, a solder ball 16 which is formed on the inner side of bent portion 15 in carrying out the solder dip on the external leads, does not reach the positioning portion 14. As a result, unlike in the prior art case, at the time external leads 13 are soldered to printed circuit board 17, package can be fixed straight, not inclined, to the board. This can prevent generation of cracks on the internal semiconductor pellet or separation of wiring lines from the board that is common in the prior art devices. According to the prior art technique, 3 to 50% defects are produced due to a solder ball in assembling the semiconductor devices; however, with the use of the semiconductor device according to this embodiment, the generation of defects can be suppressed to nearly 0%.

In this invention, every other external lead can be longer than the other external leads, such that when it is bent, its positioning portion 14 will be at the same level with the portions 14 of other external leads which are not bent.

What is claimed is:

1. A single in-line type semiconductor device comprising:

a package;

a plurality of first external leads, each having an upper portion and a distal end portion, drawn vertically from one edge portion of the package and arranged in a row;

a plurality of second external leads, each having an upper portion and a distal end portion, drawn out vertically from said one edge portion, said second external leads being bent at respective upper portions thereof such that said distal end portion of each said second external lead is offset from a plane formed by said row of first external leads, said first and second external leads extending alternately from said one edge portion; and said upper portions of each said first and second external leads having a first width, and said distal end portions of each said first and second external leads having a second width less than said first width, each of said first and second external leads having a positioning portion at the transition between said upper portion and said distal end portion, said positioning portions of said first and second external leads being formed at a first linear distance from said one edge portion of said package.

2. The semiconductor device according to claim 1, wherein said package includes a heat discharge plate disposed adjacent a first surface thereof and a semiconductor pellet disposed adjacent said heat sink.

3. The semiconductor device according to claim 1, wherein each said second external lead includes two 90° bends in said upper portions thereof to offset said distal end portions of said second external leads from said plane formed by said first external leads.

4. The semiconductor device according to claim 1, wherein said positioning portion of each said second leads is formed at a location corresponding to a location 0.5 mm to 1.55 mm from the center of a circle internally touching the bend portion of each of said second external leads on a lower edge side thereof.

* * * * *